(12) United States Patent
Dietrich et al.

(10) Patent No.: US 10,998,030 B2
(45) Date of Patent: May 4, 2021

(54) INTEGRATED MEMORY DEVICE AND METHOD OF OPERATING SAME

(71) Applicant: Celis Semiconductor Corporation, Colorado Springs, CO (US)

(72) Inventors: Daryl G Dietrich, Woodland Park, CO (US); Gary F Derbenwick, Colorado Springs, CO (US)

( * ) Notice: Subject to any disclaimer, the term of this patent is extended or adjusted under 35 U.S.C. 154(b) by 0 days.

(21) Appl. No.: 15/218,336

(22) Filed: Jul. 25, 2016

(65) Prior Publication Data
US 2018/0025766 A1 Jan. 25, 2018

(51) Int. Cl.
*G11C 11/22* (2006.01)

(52) U.S. Cl.
CPC ...... *G11C 11/2275* (2013.01); *G11C 11/2255* (2013.01); *G11C 11/2273* (2013.01); *G11C 11/221* (2013.01)

(58) Field of Classification Search
CPC .......................... G11C 11/2275; G11C 11/221
USPC .......................................................... 365/65
See application file for complete search history.

(56) References Cited

U.S. PATENT DOCUMENTS

| | | | |
|---|---|---|---|
| 5,568,438 A | 10/1996 | Penchuk | |
| 5,751,626 A * | 5/1998 | Seyyedy | G11C 11/22 365/145 |
| 6,034,884 A | 3/2000 | Jung | |
| 6,147,896 A | 11/2000 | Kim et al. | |
| 6,438,020 B1 * | 8/2002 | Yamada | G11C 11/22 365/145 |
| 6,587,367 B1 * | 7/2003 | Nishimura | G11C 7/14 365/145 |
| 7,116,572 B2 * | 10/2006 | Sun | G11C 7/12 365/145 |
| 7,313,010 B2 | 12/2007 | Sun | |
| 2002/0064065 A1 | 5/2002 | Sailing | |
| 2010/0157660 A1 * | 6/2010 | Kye | G11C 11/565 365/149 |
| 2014/0029326 A1 | 1/2014 | Qidwai | |
| 2015/0036444 A1 * | 2/2015 | Seo | G11C 7/065 365/210.1 |
| 2015/0109849 A1 * | 4/2015 | Tsai | G11C 13/0069 365/148 |

* cited by examiner

*Primary Examiner* — Muna A Techane
(74) *Attorney, Agent, or Firm* — Hanes & Bartels LLC

(57) ABSTRACT

An integrated circuit memory contains a memory cell connected to a bit line that does not float during a portion or all of the read sensing part of the read cycle. The memory cell includes a data storage device. The data storage device may be a ferroelectric capacitor, a linear capacitor, a floating gate transistor, a magnetic device, a resistive device or other type of data storage device capable of placing a charge on the bit line corresponding to a specific data state of the memory cell. The bit line and a reference bit line are connected to a differential amplifier and precharged to specified voltages. Preferably, a self-nulling sense amplifier circuit is connected to the bit lines that compensates for sense amplifier offset by applying additional charges on the bit lines. Alternatively, charge sources may be connected to the bit lines to provide additional charges on the bit lines during the read cycle. Memory cells according to this invention can be configured to provide a reference cell for the reference bit line.

28 Claims, 11 Drawing Sheets

| Bit Line/Cell Capacitance Ratio | Read Signal Strength (%) | Series Configuration Switching Voltage Strength (%) |
| --- | --- | --- |
| 0:1 | 100 | 0 |
| 0.25:1 | 80 | 20 |
| 0.5:1 | 67-2/3 | 33-1/3 |
| 1:1 | 50 | 50 |
| 2:1 | 33-1/3 | 67-2/3 |
| 3:1 | 25 | 75 |
| 4:1 | 20 | 80 |
| 5:1 | 16.7 | 83.3 |
| 10:1 | 9.1 | 90.9 |
| 20:1 | 4.8 | 95.2 |

FIG. 2

INTEGRATED MEMORY DEVICE AND METHOD OF OPERATING SAME

FIELD OF THE INVENTION

The current invention relates to integrated circuit devices and methods of operation thereof, and more particularly, to integrated circuit memory devices that sense the data state of a memory cell along bit lines and methods of operation thereof, but its scope applies to any memory cells and memory arrays that may use features of this invention. A memory device may be a semiconductor memory chip, an embedded memory array or a memory macro but also could be any latches that might store data or logic states of information, among others.

BACKGROUND OF THE INVENTION

Integrated circuit memory devices are used to store information in a wide variety of electronic devices including, among others, personal computers, laptop computers, tablets, cellular telephones, data servers, digital cameras and video recorders. For example, an integrated circuit memory device may be used to store data for retrieval and processing by a microprocessor or similar data processing device. In order to read data stored in a memory device, the microprocessor typically supplies a memory address to an address input of the integrated circuit device, e.g., drives an address bus to which the microprocessor and the memory device are connected. The microprocessor and memory device may be on the same silicon chip or on separate silicon chips. In response, the memory device produces the data stored in the desired memory location at an output port. Internally, the memory device must have circuitry that takes the memory address, accesses the appropriate memory locations, reads the logic states of the memory cells and then routes the information to the output port.

A memory array typically has a plurality of word lines running in one direction and a plurality of bit lines running orthogonal to the word lines, allowing each memory cell to be addressed by a specific word line and a specific bit line. During a read operation, a signal is generated on the bit line by a data storage device and this signal is read by a sense amplifier connected to the bit line prior to the read data being routed to the output port.

A major goal for integrated circuit memories is to use the smallest memory cell size so that the cost per bit will be lowest and the memory capacity or density on a single silicon chip will be highest. The problem is that the read signal margin attainable by conventional memory designs limits the minimum size memory storage device that can be used and therefore limits the smallest memory cell size.

Read signal margin is limited by two significant issues in typical memory designs. First, because of manufacturing process variations, typical latching sense amplifier circuits that read the data states of memory cells along the bit lines have variable so-called offsets that limit the ability of these sense amplifiers to reliably detect very small signal differences on bit lines. Secondly, when memories that store data on charge storage capacitors use floating bit lines for the sensing portion of the read cycle, a capacitor divider effect reduces the read signal margin.

The read cycle of conventional prior art memories includes two necessary steps. First, bit lines are precharged to a predetermined voltage, typically ground potential commonly referred to as Vss. Second, charge is transferred between the memory cells and the bit lines. The amount of charge deposited on a bit line by a memory cell determines whether the memory cell was previously programmed in a logic "1" or logic "0" state. For memory cells that include charge storage capacitors, typically the bit lines are floating between these two steps, meaning they are only capacitively coupled to surrounding circuit nodes. This two step read process limits the read signal strength that might otherwise be attainable.

With respect to the first issue, a sense amplifier has an active input and a reference input. The sense amplifier must be designed and physically laid out as symmetrically as possible with respect to the active and reference inputs in order to detect the smallest bit line signals possible. Lack of symmetry in the operation of sense amplifiers is often characterized by what is commonly referred to as sense amplifier offset that causes the sense amplifier to favor reading one data state or the other.

The semiconductor industry has spent considerable effort in designing latching sense amplifiers with as little offset as possible. However, manufacturing process variations, including reticle alignment accuracies, cause the offset to vary and limit how well these sense amplifiers can perform. These variations can affect the circuits on different parts of the same chip of silicon as well as circuits on different chips of silicon and different manufacturing lots of silicon, providing non-uniform behavior of the sense amplifiers. Sense amplifier offset affects virtually every type of integrated circuit memory that uses bit lines whether or not the bit lines are floating during the sensing portion of the read cycle. Sense amplifier offset is well known to those skilled in the art.

With respect to the second issue, two common types of integrated circuit memories that store data on charge storage capacitors and use floating bit lines for the read sensing operation are dynamic random access memories (DRAMs) where the data are held by charge stored on capacitors and ferroelectric random access memories (FRAMs) where the data are held by the direction of a polarization field within ferroelectric capacitors. The DRAM charge storage capacitor is sometimes referred to as a linear capacitor to distinguish it from a ferroelectric capacitor, but the DRAM charge storage capacitor may have some non-linear characteristics.

DRAMs are volatile in that the data must be refreshed in the memory at regular and short intervals (typically less than 100 millisecond refresh time) because the data are lost even if the power remains applied to the memory. FRAMs are nonvolatile in that the data remain even when the power is removed because the polarization field within the ferroelectric capacitor remains. Typical DRAMs and FRAMs have read cycles that are destructive meaning that the logic state in a memory cell is lost during the read operation. In this case, the data in the memory cell is replaced at the end of the read cycle, often called the restore or rewrite part of the read cycle.

Typical operation of DRAMs and FRAMs have the charge storage capacitor configured in series with the capacitance of a floating bit line for the read sensing operation. The charge from the DRAM capacitor or the FRAM ferroelectric capacitor shares between the capacitance of the charge storage capacitor and the bit line capacitance. This charge sharing reduces the read signal strength obtainable on the bit line. In the case of an FRAM, the series capacitance effect also limits the magnitude of the switching voltage that can be applied across the ferroelectric capacitor Because the capacitor divider effect affects both read signal attenuation and the magnitude of the switching voltage in a typical FRAM, it is useful to review the operation of a typical FRAM. FIG. 1 shows a schematic of the configuration of a typical FRAM according to prior art for an n-channel implementation. For simplicity, schematics based on n-channel transistor implementations and 1T/1C memory cells are shown in the current patent. It is clear to one skilled in the art that the schematics can be implemented using p-channel transistors instead of n-channel transistors. For the same drive p-channel word line transistors are larger adding more capacitance to the bit line but may have advantages in certain applications such as radiation hardened circuits because n-channel transistors that show increase in leakage current after ionizing radiation are not used in the memory array. Converting the circuits from n-channel to p-channel is straightforward for one skilled in the art. A DRAM is similar to the circuit shown in FIG. 1 except ferroelectric capacitor 22 is replaced by a linear capacitor and for the sensing portion of the read cycle electrode 29 of the linear DRAM capacitor is typically at ground potential Vss. Ground potential Vss and power supply voltage Vdd are typically referred to as the power supply rails.

A typical FRAM has a plate line 32 running parallel to word line 28, although in some cases plate line 32 might run parallel to bit line 30. One electrode 29 of ferroelectric capacitor 22 is connected to plate line 32 on which the voltage can be varied. The opposite electrode 27 of the ferroelectric capacitor 22 is connected through word line transistor 25 to bit line 30 when the memory cell is selected for the read operation. The ferroelectric memory cell consists of ferroelectric capacitor 22 and word line transistor 25. Ferroelectric memory capacitor 22 is in series with bit line parasitic capacitance 23 for reading the logic state of a memory cell. Bit line capacitance 23 is actually distributed along the length of the bit line but for clarity it is shown in FIG. 1 as a lumped capacitance. For the sensing portion of the read cycle, bit line 30 is floating, meaning that it is only capacitively coupled to neighboring nodes.

Typically, the logic state of an FRAM memory cell is stored by one of two directions of the polarization field within ferroelectric memory capacitor 22, as is familiar to one skilled in the art. The two different polarization directions can be programmed into ferroelectric capacitor 22, one resulting when sufficient positive electrical voltage is applied from plate line 32 to bit line 30 and the other resulting when sufficient positive electrical voltage is applied from bit line 30 to plate line 32. For a subsequent read operation, if an electrical voltage is applied to ferroelectric capacitor 22 on plate line 32 with word line transistor 25 on and bit line 30 floating, the polarization direction in ferroelectric capacitor 22 will either switch to the opposite polarization direction (typically referred to as opposite state) or will remain in the same direction (typically referred to as same state) depending on whether a logic state "1" or logic state "0" was previously written into ferroelectric capacitor 22. In both polarization cases, there is a linear charge that will flow out of ferroelectric capacitor 22 onto floating bit line 30 due to the linear capacitance of ferroelectric capacitor 22. This linear charge will be the same for logic states "1" or "0." However, if the polarization of ferroelectric capacitor 22 switches to the opposite state during the sensing portion of the read cycle, an additional charge, typically referred to as switched charge, will flow onto floating bit line 30 causing the voltage generated on floating bit line 30 to be higher than that if only the linear charge flows onto bit line 30. This difference in voltage on bit line 30 for a stored logic state "1" or "0" during the sensing portion of the read cycle allows a logic state "1" to be distinguished from a logic state "0" by a latching sense amplifier connected to bit line 30 and powered at a predetermined time during the read cycle. Design and operation of sense amplifiers is well known to one skilled in the art. Because this FRAM read is destructive, data are rewritten into ferroelectric memory capacitor 22 at the end of the read cycle with the sense amplifier providing an appropriate voltage on bit line 30 while plate line 32 is cycled in voltage.

The read cycle timing and operation during the sensing portion of the read cycle is well known to one skilled in the art. For the current invention, the sensing portion of the read cycle is defined as the time between when precharging of bit line 30 (typically to ground potential Vss) is completed using transistor 24 and the time that a latching sense amplifier is powered to latch the data.

At the start of the sensing portion of the read cycle the sense amplifier is not powered. Bit line 30 is precharged to ground potential by turning on transistor 24. Transistor 24 is then turned off allowing bit line 30 to float. Transistor 25 is turned on, connecting electrode 27 of ferroelectric capacitor 22 to floating bit line 30. A voltage sufficient to switch the polarization state of ferroelectric capacitor 22 is then applied to plate line 32. As the voltage on plate line 32 is increased, the voltage to which bit line 30 rises during the sensing portion of the read cycle depends on the direction of polarization previously set in ferroelectric capacitor 22 and whether the polarization direction of ferroelectric capacitor 22 switches. After a predetermined amount of time where the voltage on bit line 30 is still below the power supply voltage, a latching sense amplifier connected to bit line 30 is powered to latch the data state of the memory cell, completing the sensing portion of the read cycle in preparation for the data to be directed to the output port of the memory.

The problem is that for a floating bit line 30, ferroelectric capacitor 22 and bit line parasitic capacitance 23 are in a series electrical circuit configuration, typically known as a capacitor divider, during the sensing portion of the read cycle. When the voltage is applied to plate line 32 of ferroelectric capacitor 22 for the sensing portion of the read cycle, the voltage divides between ferroelectric capacitor 22 and bit line capacitance 23, thereby reducing the amount of voltage available to cause adequate switching of the polarization direction of ferroelectric capacitor 22. This can result in less read signal amplitude and margin. With respect to the switching voltage across ferroelectric capacitor 22, this capacitor divider effect becomes more severe for a shorter bit line 30 that has smaller bit line capacitance 23. Therefore, the capacitor divider effect limits the smallest bit line capacitance 23 that might be used because the voltage across the ferroelectric capacitor 22 to cause its polarization direction to switch can be inadequate.

Conversely, to reduce the effect of this switching voltage reduction across ferroelectric capacitor 22 during the sensing portion of the read cycle, a bit line 30 with more capacitance 23 might be used. However, higher capacitance 23 on bit line 30 attenuates the read signal (voltage generated on bit line 30) because of the capacitor divider effect, resulting in an inadequate voltage difference on bit line 30 between a logic state "1" and logic state "0" to be reliably distinguished by a sense amplifier. So there is a serious trade off in the design of such a conventional FRAM determined by the ratio of bit line capacitance 23 to linear capacitance of ferroelectric capacitor 22. This trade off limits the minimum area ferroelectric capacitor 22 that can be used, the minimum size memory cell that can be used and the ability to scale the FRAM technology to smaller technology nodes. These factors increase the cost per bit of a typical FRAM.

With respect to a DRAM, higher capacitance on a bit line causes the read signal to be attenuated similarly to that of an FRAM. However, a DRAM memory capacitor does not have to switch by applying a voltage to a plate line, so a DRAM does not have the switching voltage issue.

FIG. 2 summarizes the capacitor divider trade-off by showing the read signal strength and switching signal strength as a function of the bit line to ferroelectric memory storage capacitor capacitance ratio. For this ratio, the capacitance of the ferroelectric capacitor is the linear capacitance of the ferroelectric capacitor. For example, for a 5 to 1 bit line capacitance to cell capacitance ratio that may be typical of today's FRAM designs, while the switching voltage can be larger than 80% of the power supply voltage, the read signal strength is reduced more than a factor of 5 (less than 20% read signal strength). For a 1 to 1 bit line capacitance to cell capacitance ratio, the read signal strength is reduced by a lesser amount of 50%, but the switching voltage is reduced by a larger factor of two.

Because of these signal strength problems, FRAMs typically use a pair of circuits shown in FIG. 1 for each memory cell. This is often referred to as a two transistor, two capacitor (2T/2C) memory cell. One circuit goes to one side of the latching sense amplifier and the other circuit goes to the reference side of the latching sense amplifier. One of the two ferroelectric capacitors is programmed to one polarization direction and the other ferroelectric capacitor is programmed to the opposite polarization direction to provide a stronger differential signal into the sense amplifier. During the sensing portion of the read cycle, the polarization direction of one of the ferroelectric capacitors switches (opposite state) and the polarization direction of the other ferroelectric capacitor does not switch (same state). The differential in voltage generated on the two floating bit lines during the sensing portion of the read cycle is sensed by a latching sense amplifier powered at a predetermined time during the read operation. Which of the two capacitors that switches polarization direction determines if the logic state of the 2T/2C memory cell is a "1" or a "0".

The 2T/2C memory cells are approximately twice the size of memory cells that employ a single ferroelectric capacitor. These latter types of memory cells are typically referred to as 1T/1C memory cells, but the industry has had a difficult time developing a sense amplifier reference signal that allows a logic state "1" to be distinguished reliably from a logic state "0". This difficulty arises because of low read signal strength on the bit lines and sense amplifier offset. In addition, the absolute bit line voltages can vary depending on a number of factors, such as with time during the sensing portion of the read cycle and with decrease of polarization of the ferroelectric capacitors over time. A fixed reference voltage is therefore not the best type of reference for a 1T/1C FRAM configuration. For a given technology node, the 2T/2C memory cells double the cost per bit of a 1T/1C memory cell and reduce the memory capacity (total number of data bits) or density for a given area of silicon by half.

With respect to the operation of a DRAM, the data are stored in the form of charge on a linear capacitor using a circuit almost identical to that in FIG. 1. However, ferroelectric capacitor 22 is replaced by a linear capacitor that has no polarization within it and the plate line is held at ground potential for both read and write operations, as previously noted. During a write operation, charge is applied and stored on the DRAM capacitor by a voltage applied on the bit line for one logic state. For the other logic state, charge is not applied on the DRAM capacitor by holding the voltage on the bit line at ground potential. During the sensing portion of the read cycle, in contrast to an FRAM, it is the charge stored on the DRAM capacitor rather than switched charge that flows onto the bit line. Like the FRAM, this charge shares with that of the floating bit line capacitance. Therefore the read signal strength attenuation shown in FIG. 2 also applies to DRAMs.

SUMMARY OF THE INVENTION

In light of the foregoing, it is an object of this invention to provide a new read method that increases the read signal margin by adding an additional step to the read cycle where additional charge is applied to the bit lines between the two steps of precharging the bit lines and transferring charge between the bit lines and the memory cells. It is another object of this invention to use this new read method for memories that use charge storage capacitors by using a memory circuit configuration that does not use floating bit lines during a portion or all of the sensing part of the read cycle to improve read signal margin. It is another object of this invention to use the new read method by providing a preamplifier that nulls out its voltage offset and operates with non-floating bit lines to reliably sense small voltage excursions on bit lines, improving read signal margin. It is another object of this invention to allow a smaller memory storage device, resulting in a denser memory configuration that provides for more memory capacity on a silicon chip and reducing the cost per bit. It is another object of this invention to use the new read method to provide an FRAM with a reduced read voltage for higher endurance nonvolatile memory applications. It is another object of this invention to use the new read method to provide a reference memory cell that provides a reliable reference for a 1T/1C FRAM memory cell configuration. It is further object of this invention to use the new read method to provide a reference memory cell that provides a reliable reference for a DRAM memory cell configuration.

These and other objects, features and advantages are provided according to the current invention by integrated circuit memory devices and methods in which higher capacity, lower cost per bit and more reliable semiconductor memories can be manufactured.

The current invention provides an integrated circuit preamplifier with a self-nulling feature and associated reference circuits that eliminate offset of the preamplifier allowing the preamplifier to sense small read signal voltage differentials on non-floating bit lines. This self-nulling preamplifier circuit can be used in reading data states in almost any type of integrated circuit memory where small signals on bit lines need to be detected.

The current invention provides a method of operation where the bit lines do not float during part or all of the read sensing portion of the read cycle for integrated circuit memories that typically have used floating bit lines for the sensing portion of the read cycle. For FRAMs, use of non-floating bit lines reduces the limitation on switching voltage on the ferroelectric capacitor during the sensing portion of the read cycle while at the same time allowing the read signals to be reliably sensed. For DRAMs, use of non-floating bit lines increases the read signal margin by allowing a self-nulling preamplifier to be used that can sense small signal differentials on bit lines and overcome offsets common to latching sense amplifiers.

The memory cells and methods of operation that are objects of the current invention can be configured to provide reference cells used in reliably sensing the logic state of 1T/1C and 2T/2C FRAM memory cells. These types of reference cells and memory array architectures of the current invention also can apply to prior art FRAM architectures that use floating bit lines. The current invention also provides reference cells to be used reliably for DRAMs.

For a given technology node or design rule, the combined effect of these improvements can result in memory cells that require less silicon area than the prior art memory cells, improving the memory capacity for a given silicon chip area, reducing the cost per bit, providing a higher level of reliability, and allowing the memory cell to scale to smaller technology nodes.

The present invention provides an integrated circuit memory device comprising: a memory storage device, a bit line that does not float during a portion or all of the read sensing part of the read cycle, and a circuit for applying additional charge to the bit line during the read cycle. A self-nulling preamplifier that senses the voltage or charge on non-floating bit lines can be used or, alternatively, charge sources can be applied directly to the bit lines. The charge source may be a current source, a voltage source with a sufficient effective series resistance, or any other device capable of providing an appropriate charge on the bit line. The memory storage device may be an FRAM ferroelectric capacitor, a DRAM linear capacitor or any other type of memory storage device capable of providing a charge on the bit line for reading the state of a memory cell.

The current invention also provides an integrated circuit memory device reference cell that operates with non-floating bit lines comprising: a pair of memory storage devices programmed to opposite data states and connected in a parallel circuit configuration at a predetermined time during the read cycle to provide a reliable reference signal for a sense amplifier.

The current invention also provides a DRAM integrated circuit memory device reference cell that works with a self-nulling preamplifier comprising: a capacitor programmed at a voltage less than the programming voltage for an active memory cell.

The current invention also provides a DRAM integrated circuit memory device reference cell that works with a self-nulling preamplifier comprising: a capacitor with a lesser capacitance value than that in an active memory cell.

BRIEF DESCRIPTION OF THE DRAWINGS

FIG. 2 is a table that shows the theoretical read signal strength and switching voltage strength across a ferroelectric capacitor as a function of the ratio of the bit line to cell capacitance for floating bit lines for the sensing portion of the read cycle.

DETAILED DESCRIPTION OF PREFERRED FORM OF THE INVENTION

Figure 1:
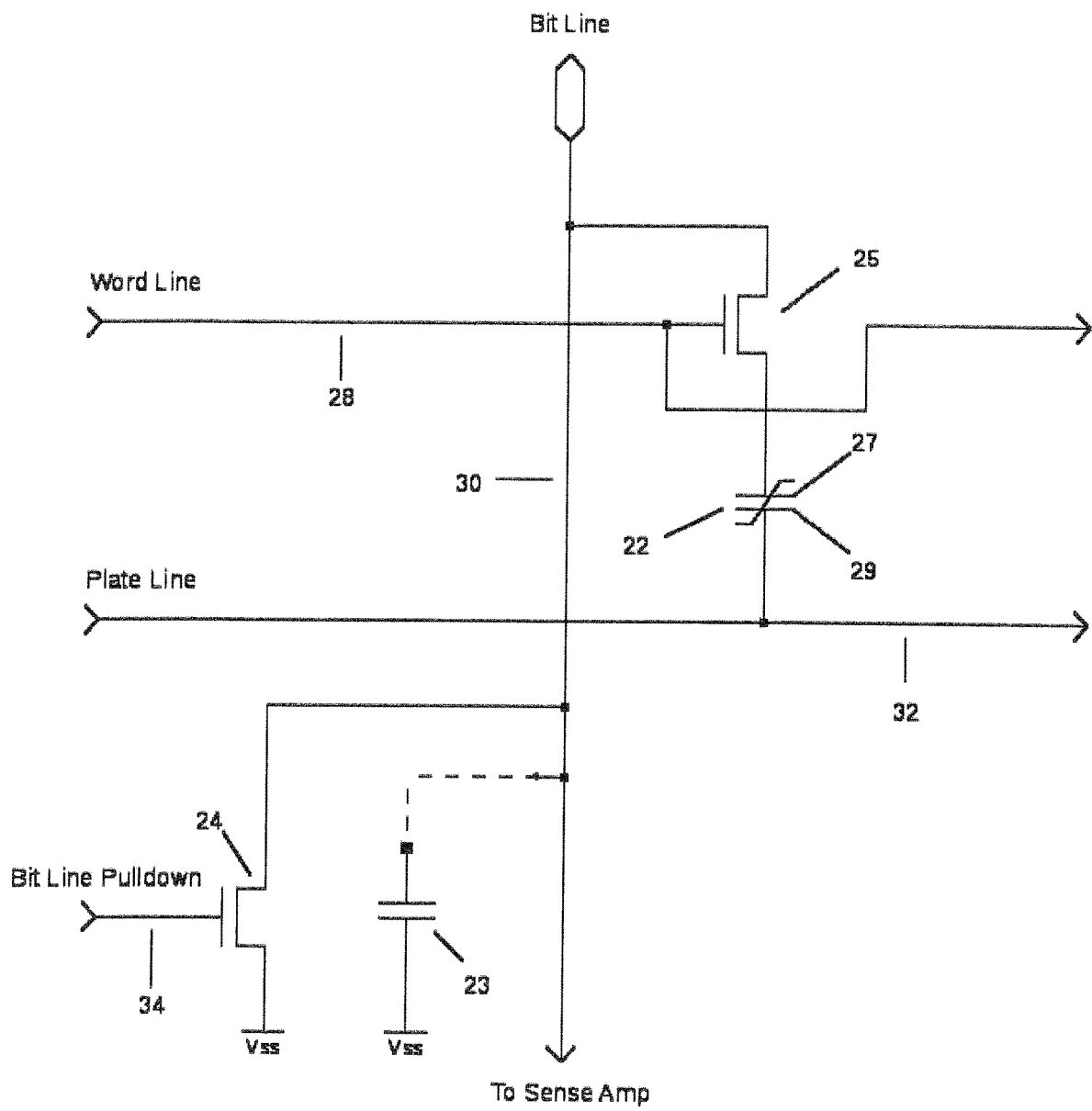
FIG. 1 is a schematic diagram of a prior art memory cell of an FRAM.

In contrast to prior art memories that have used floating bit lines, such as DRAMs and FRAMs, the preferred embodiment of the current invention (1) operates with non-floating bit lines during the sensing portion of the read cycle, (2) uses a self-nulling differential preamplifier that applies additional charge to non-floating bit lines to eliminate offset in the preamplifier so that small data signals on bit lines can be sensed, (3) uses a latching sense amplifier connected to the outputs of the preamplifier in order to latch the data, and (4) uses a reference memory cell design based on the current invention to provide a reference signal for the preamplifier.

An alternate embodiment of the current invention for an FRAM (1) operates with non-floating bit lines during the sensing portion of the read cycle, (2) applies additional charge to the bit lines during the sensing portion of the read cycle, and (3) uses a reference memory cell design based on the current invention to provide a reliable reference signal for the sense amplifier. Alternatively, a different reference for the sense amplifier, such as a fixed reference voltage or other type of reference, might be used instead of the reference memory cell design based on the current invention.

In contrast to considerable industry effort to precharge bit lines to as close to the same voltage as possible prior to the read sensing portion of the read cycle and to design latching sense amplifiers with as close to zero offset as possible, the current invention takes a different approach by using internal feedback in a self-nulling differential amplifier to intentionally apply small compensating differential charges on at least a pair of non-floating bit lines connected to the inputs of the self-nulling differential preamplifier prior to the read sensing portion of the read cycle in order to eliminate output voltage offset in the self-nulling differential preamplifier. The amplified output of this preamplifier that is applied to the input of a latching sense amplifier that is powered at the end of the sensing portion of the read cycle overcomes any offset voltages in such conventional latching sense amplifiers. It is this self-nulling innovation of this preamplifier circuit that enables it to detect subsequent small excursions of voltages on bit lines when reading a memory cell and provide an amplified signal to a latching sense amplifier. With this approach, offset levels common to latching sense amplifiers no longer cause a limitation during the read cycle and very small read signals on bit lines can be reliably detected.

Under normal operation, the magnitude of the small differential voltage resulting on the bit lines as a result of the charge applied to the bit lines during the self-nulling operation is approximately the differential output voltage of the preamplifier caused by its offset divided by the gain of the preamplifier. Once the output offset has been nulled, the nulling circuitry is turned off and any small subsequent change in bit line differential voltage will cause the output of the preamplifier to change by approximately the change in differential bit line voltage times the gain of the amplifier. Preferably, the gain of the preamplifier is of the order of 20 to 100 depending on the memory architecture and memory type.

In summary, the preamplifier uses non-floating bit lines connected to it to provide relatively small charges on the bit lines that null out the offset in the preamplifier circuit prior to sensing the data state of a memory cell. This self-nulling feature is critically important because the offset in a circuit varies with processing parameters, reticle alignment accuracy, silicon chip, silicon wafer, silicon manufacturing lot, etc., and is therefore not very controllable. However, the preamplifier will self-null no matter what the actual offset is. The preamplifier is sensitive in that a few millivolts caused by a few femtocoulombs of charge difference on the bit lines is readable. Because of the small bit line signals that can now be detected, good circuit design techniques for noise rejection, such as folded bit lines and other designs for common mode noise rejection, may be important for sensing very small signal excursions on the bit lines, as one skilled in the art can appreciate. The self-nulling preamplifier also allows for longer bit line implementations with more parasitic capacitance that can result in more efficient memory layouts.

For the preferred embodiment of the self-nulling preamplifier, current mirror circuits are used, although alternatively other circuits might be used. Typically, current mirror circuits are not used for sense amplifiers because they are sensitive to small variations in transistor parameters. However, the preamplifier of the current invention avoids this problem by its self-nulling feature. Preferably, the self-nulling preamplifier uses a current mirror circuit configured as a differential voltage preamplifier that has one or two of its output nodes connected to the input a more traditional latching sense amplifier. It is preferable to use a current mirror circuit consisting of a p-channel mirror combined with an n-channel mirror to increase the voltage amplification. The four transistors of the current mirror are biased in the saturation region of operation (i.e., the flat portion of the current-voltage transistor curve) where they are very sensitive to any small current changes through them.

Figure 3:
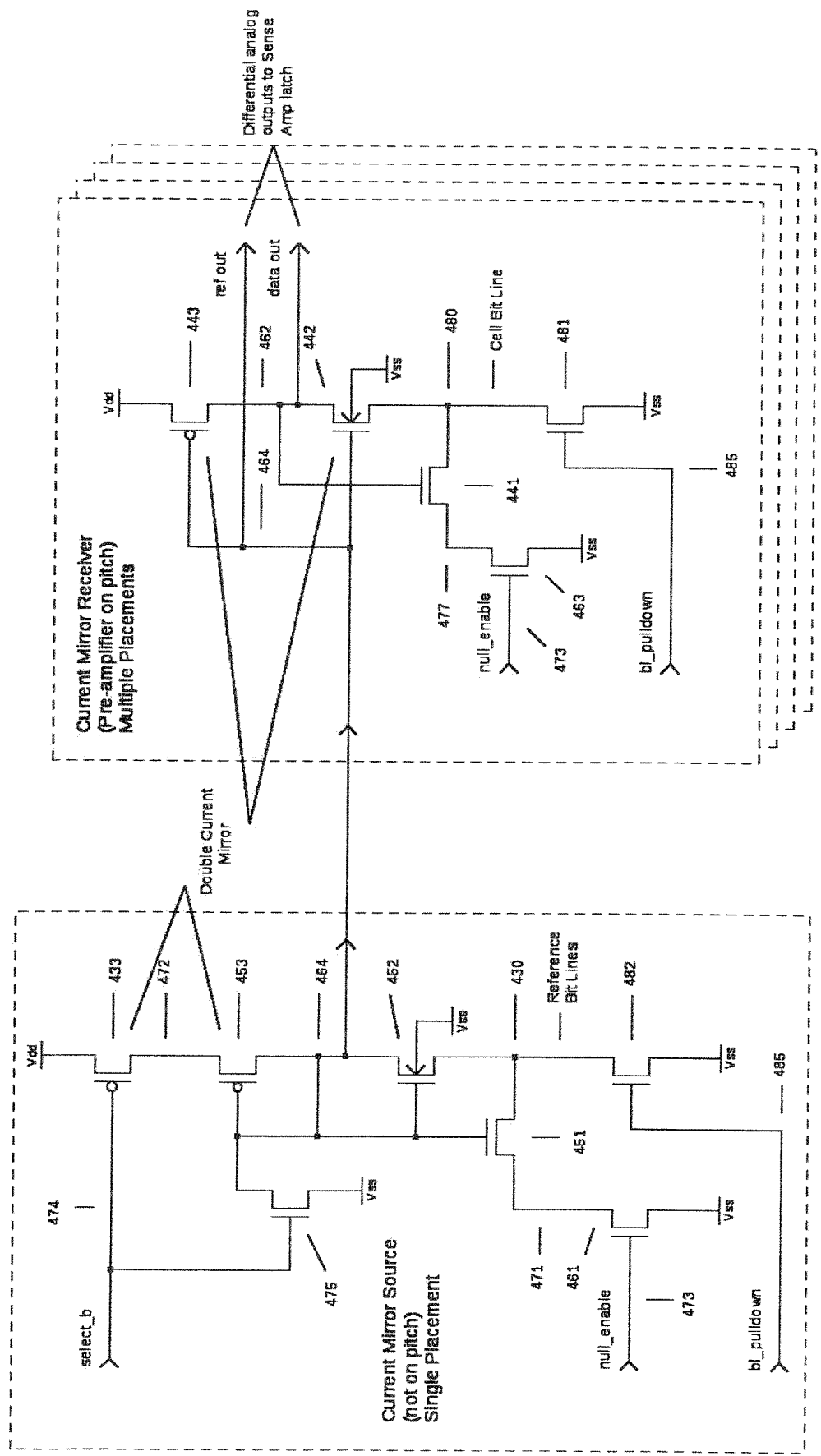
FIG. 3 is a schematic diagram of the preferred embodiment of an FRAM memory device according to the invention using a split self-nulling preamplifier for the sense amplifier.

FIG. 3 shows a schematic diagram of the preferred embodiment of the current invention for an FRAM with non-floating bit lines with the plate line being driven by a charge source for the sensing portion of the read cycle. Refer to FIG. 1 for how a word line transistor, ferroelectric capacitor and plate line are configured on active bit line 480. The plate line can be continuous for a given word line, or, alternatively, it may be divided into segments to provide smaller internal word lengths and less overall endurance stress on the memory. The self-nulling preamplifier is split into two parts, with the right receiver part (multiple instances) located with each of the active bit lines in the memory array segment and the left sending part (one instance) located with the reference cell bit lines in the same memory array segment. The sending part can drive up to 8 to 32 receiving parts, depending on the details of the design. The reference cell for bit line Bx (430) is provided by additional columns of bit lines in the same memory array segment. A preferred reference cell circuit attached to bit line 430 is discussed later.

Figure 4:
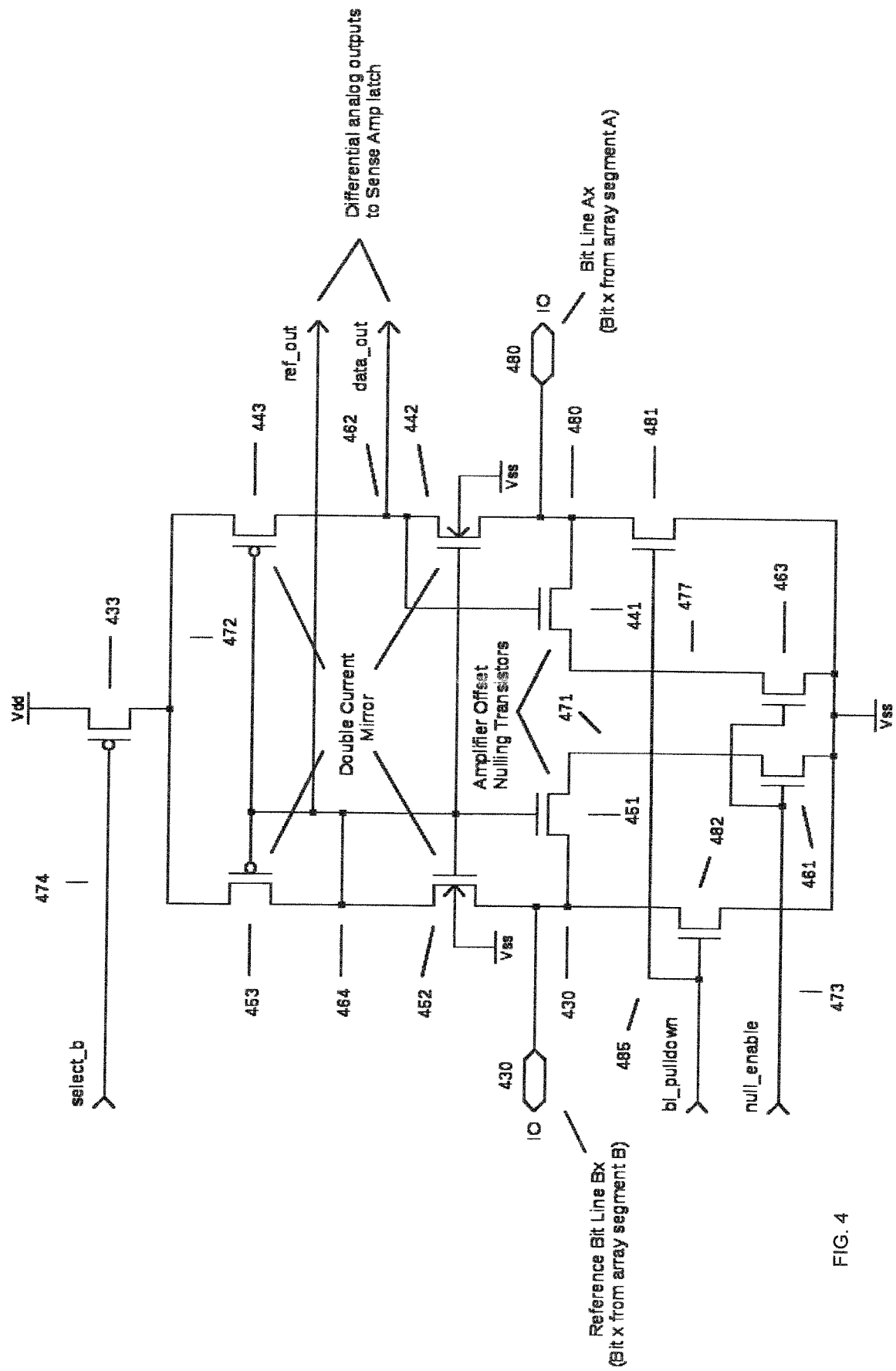
FIG. 4 is a schematic diagram of the preferred embodiment of an FRAM memory device according to the invention using a self-contained self-nulling preamplifier for the sense amplifier.

Alternatively, reference cells for bit lines Bx (430) can be provided by a row of reference cells in an adjacent memory segment B. In this case the split preamplifier in FIG. 3 is combined into one for each active bit line as shown in FIG. 4. Because the memory circuits shown in FIGS. 3 and 4 are the same with the exception of splitting the preamplifier into sending and receiving parts, the devices and nodes are numbered the same. In FIG. 4, the active bit line is preferably Ax (480) and the reference bit line is preferably Bx (430). Again, refer to FIG. 1 for how a word line transistor, ferroelectric capacitor and plate line are configured on bit line Ax (480). Alternatively, the circuit in FIG. 4 can be used for a 2T/2C FRAM configuration where each active bit line has its own reference bit line.

In the circuit in FIG. 4, alternatively it is possible to remove transistor 463 and connect nodes 471 and 477 together. However, this configuration may lead to additional current flow during the rewrite operation at the end of the read cycle. Alternatively, the schematics in both FIGS. 3 and 4 can also be used for DRAMs and other memory types.

Comparison to FIG. 1 shows that the bit lines are not floating for the circuits in FIGS. 3 and 4 because the double current mirror preamplifier is powered and connected to the bit lines. The double current mirror consists of transistors 453, 452, 443 and 442 with the gates of all four transistors connected to a common drain node 464. A more common current mirror configuration familiar to one skilled in the art is when the gates of the p-channel transistors 453 and 443 remain connected but are separate from the connected gates of n-channel transistors 452 and 442, and where the p-channel transistor gates are connected to a common drain node 464 or 462 and the n-channel gates would connect to the opposite common drain node. Both current mirror configurations provide similar voltage gain for the preamplifier. However, the configuration in FIGS. 3 and 4 has the advantage of more consistent currents through both sides of the current mirror across the full range of output voltage at node 462. Another advantage is that a fairly stable voltage of approximately half the power supply voltage Vdd exists on node 464. Another advantage is that the current mirror configuration shown in FIGS. 3 and 4 has no start-up issues upon power up whereas the more common configuration might fail to start in certain instances without additional circuitry.

After enabling the self-nulling preamplifier by turning on transistor 433, small voltages on bit lines 430 and 480 develop prior to the beginning of the sensing portion of the read cycle by charge applied to them by the preamplifier. Prior to applying a charge source to the plate line the voltages on bit lines 430 and 480 change by several millivolts during the self-nulling process. It is during this time that voltage differences in outputs on nodes 462 and 464, caused by offsets in the circuit, are canceled as a result of the small compensating voltage differences created on bit lines 430 and 480.

Once the offset voltage is nulled out on output node 462, the nulling function is disabled by turning off transistors 461 and 463, the word line transistors must be on, and the voltage on plate line 432 is increased for the sensing portion of the read cycle. It is preferable to have the word line transistors turned on at the beginning of the self-nulling process. Because the sensitive output node 462 and node 464 of this circuit have been equilibrated during the offset nulling period, node 462 is now poised to detect any small change in the voltage differential between bit lines 430 and 480 (reference and read cell bit lines as measured with respect to each other). During the sensing portion of the read cycle, the voltages on bit lines 430 and 480 may change up to several tens of millivolts because of charge applied to them by the active and reference memory cells. Because these voltage changes on bit lines 430 and 480 are relatively small during the sensing portion of the read cycle, the capacitor divider effects of bit lines 430 and 480 are mitigated by the non-floating bit line architecture allowing for further improved read signal margin.

Preferably, output nodes 462 and 464 are connected directly to the input nodes of a latching sense amplifier. Alternatively, output nodes 462 and 464 may be connected through multiplexers to the input nodes of latching sense amplifiers. Note that the latching sense amplifier is not powered during the nulling and sensing portions of the read cycle so that the latching sense amplifier adds only a small amount of capacitance to the bit lines. It should be noted that the voltage on output node 462 reaches a value approximately one transistor threshold voltage above ground potential Vss. However, the voltage on output node 464 is approximately one half the power supply voltage Vdd and does not vary much. Therefore, alternatively, a reference voltage of approximately one half the power supply voltage Vdd might be applied to the conventional latching sense amplifier instead of utilizing node 464.

The output nodes of the latching sense amplifier are connected to the bit lines. This has little effect on the nulling and sensing portions of the read cycle as noted above, but allows the latching sense amplifiers to apply the proper voltages to the bit lines for the rewrite cycle at the end of the read cycle.

With respect to the operation of the circuits in FIGS. 3 and 4, transistors 452 and 453 will set a base current in bit line 430. A current of approximately 10 microamps is a reasonable target in that it will take 10 nanoseconds to charge a one picofarad bit line capacitance 100 millivolts. The current in bit line 430 will continuously try to reflect in bit line 480 through transistors 442 and 443. Node 462 is sensitive and a change in voltage of only several millivolts on bit lines 430 and 480 relative to each other can cause the amplified voltage on node 462 to become within a few hundred millivolts of either the power supply voltage Vdd or ground potential Vss.

Transistors 451 and 441 are used to compensate for the offset caused by process and manufacturing variations. For example, assume there is a transistor deviation in the circuit causing node 462 to be higher in voltage than node 464 when the circuit is enabled with bit lines 430 and 480 precharged to ground potential Vss. With transistors 451 and 441 enabled at the same time, the higher gate voltage on transistor 441 will cause it to shunt more current away from bit line 480 than transistor 451 shunts from bit line 430 thus causing a relative voltage increase on bit line 430 that also causes a slight rise in the voltage on node 464. This in turn slightly weakens the drive of transistor 443 while slightly strengthening the drive of transistor 442. Node 462 must correctively drop in voltage as a result. This nulls the preamplifier with a voltage difference remaining on bit lines 430 and 480 approximately equal to the initial offset of the preamplifier divided by the gain of the preamplifier. The voltage on plate line 432 is then increased and the preamplifier is now poised to detect further relative changes in the voltages of bit lines 430 and 480 caused by unequal charges being placed on them by the memory storage device electrically connected to bit line 480 and the reference charge storage devices on reference bit line 430.

The nulling transistors 441 and 451 in the circuit in FIG. 4 are configured to allow the rewrite operation to occur at the end of the read cycle. For the rewrite operation, the latching sense amplifier drives the bit lines 430 and 480 to opposite logic states according to the read data. Because the gate of nulling transistor 441 is connected to output node 462 and the gate of nulling transistor 451 is connected to output node 464, it is important that nulling transistors 441 and 451 do not both turn on during the rewrite portion of the read cycle. Transistors 461 and 463 ensure this is the case.

The switching voltage for the ferroelectric capacitor is provided by the increase of voltage on the plate line caused by a charge source. In order to control the rise time of the voltage on the plate line, it is preferable to use a charge source that limits the current, such as a current source or a voltage source with sufficient series resistance. The rise time of the voltage on the plate line can be relatively constant (i.e., the change in voltage with time is constant). For a non-switching ferroelectric capacitor (one of the data logic states), the current in bit line 480 quickly reaches approximately a constant value related to the linear capacitance of the ferroelectric capacitor. For a switching ferroelectric capacitor (the other data logic state), the linear current plus the switching current also reaches approximately a constant value and flows well before the polarization state of the ferroelectric capacitor changes to the opposite state. Preferably, the sensing portion of the read cycle ends when the voltage applied to the ferroelectric capacitor reaches the coercive voltage (the point at which half of the ferroelectric domains have switched direction). This accomplishes a pseudo non-destructive read for which a subsequent read can be performed before the polarization fully switches. The subsequent read should be performed at a higher voltage than the previous read in order to assure further switching of the ferroelectric capacitor.

Read signal margin is sacrificed for the pseudo non-destructive read, but a pseudo non-destructive read has the advantage that the endurance (the number of read/write cycles before the polarization switching of a ferroelectric capacitor seriously degrades) of an FRAM can be increased. It also has the advantage that a word line of ferroelectric reference memory cells in an adjacent memory segment can be used as references for 1T/1C memory architectures using the circuit in FIG. 4 without added concern for endurance limitations of the reference memory cells. However, the reduced voltage read causes partial switching of the ferroelectric capacitor that results in a reduction in same state polarization. Therefore, without a rewrite operation at the end of the read cycle the memory cell may be read typically one additional time. Preferably, the data are restored in a rewrite operation at the end of every read cycle. A subsequent read cycle without a previous rewrite might be useful if there is a glitch in the memory operation during a read cycle, such as might be caused by a radiation-induced single event upset. A rewrite should occur on the first read cycle after power up for each memory address.

Figure 5:
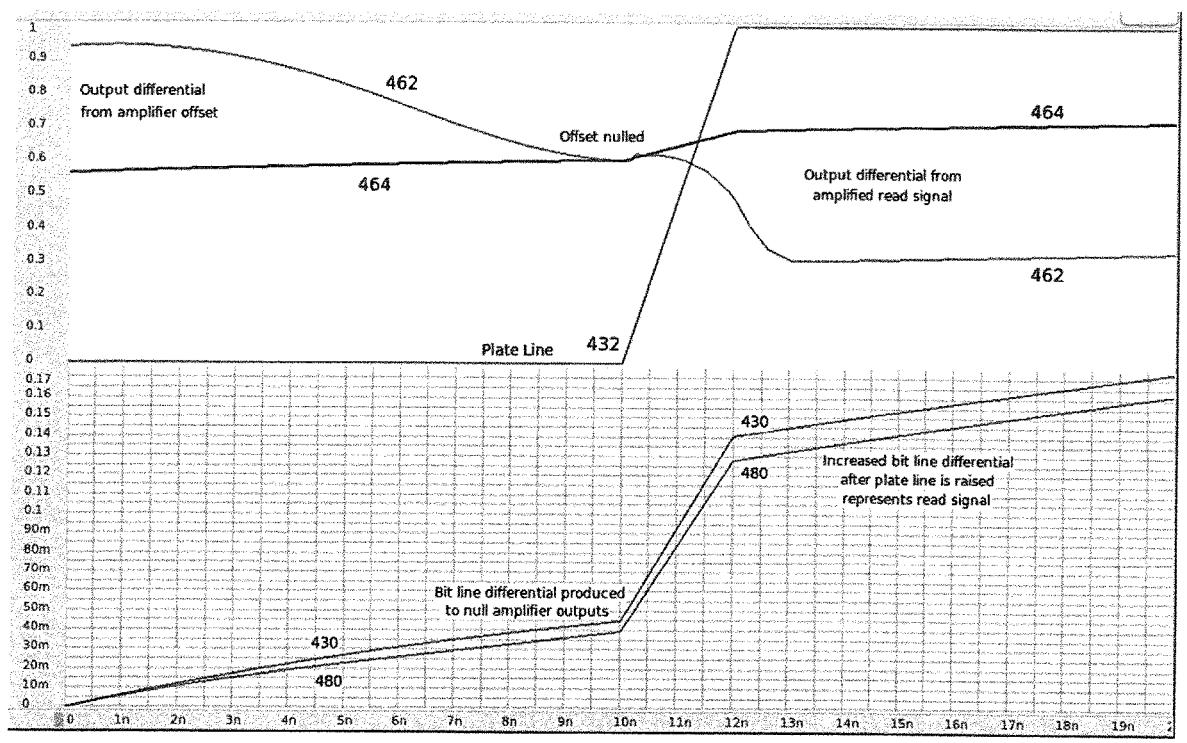
FIG. 5 is a simulation of self-nulling preamplifier output voltages and bit line voltages during the self-nulling operation followed by the read sensing operation for an FRAM.

A read cycle simulation is shown in FIG. 5 for one memory cell logic state for the circuit shown in FIG. 4. The other memory cell logic state behaves similarly. First the bit lines are precharged to specific voltages. Typically, bit lines 430 and 480 would be precharged to the same voltage, usually ground potential Vss. However, they might be precharged to differently voltages in certain designs, such as if the amplifier has a specific offset designed into it. FIG. 5 shows both bit lines have been precharged to zero volts before the nulling portion of the cycle begins.

The lower half of FIG. 5 shows simulated voltages on bit lines 430 and 480 and the upper half of FIG. 5 shows simulated voltages on output nodes 462 and 464 as well as the voltage on the plate line. The vertical scales are different for the bit lines and output nodes so that the small signals on the bit lines can be resolved. The "m" in the vertical scale means millivolts. The horizontal scale is in seconds. The "n" in the horizontal scale means nanoseconds. Nodes are labeled corresponding to those in FIG. 4. The power supply voltage is 1.5 volts and the maximum plate line voltage during the sensing portion of the read cycle is 1.0 volt.

For a current mirror it is important to have the ratio of the n-channel and p-channel transistors on either side of the mirror matched as best as possible. For the simulation in FIG. 5, transistors in the circuit were mismatched by about 5% to represent the real case for the effects of integrated circuit processing variations. This mismatch causes the different voltages on the output nodes of the preamplifier for time equal zero. This separation in voltage of almost 400 millivolts represents the offset in the preamplifier due to process variations. Note that this offset is nulled out at the conclusion of the nulling cycle. To minimize initial offset in the preamplifier, the preamplifier circuit should be geometrically laid out on the reticles to compensate for process and reticle alignment variations as much as possible.

Again referring to FIG. 5, the differential voltages developed on bit lines 430 and 480 are of the order of a few millivolts after nulling. The nulling time for the preamplifier for the sense amplifier is around 10 nanoseconds, but this nulling can start almost immediately after the memory address is supplied to the memory so it occurs in parallel with other functions during the read cycle and does not slow down the overall read cycle appreciably. The nulling time can be adjusted by modifying transistor parameters in the preamplifier.

The sensing portion of the read cycle starts at approximately 10 nanoseconds with a voltage ramp applied to the plate line between 10 nanoseconds and 12 nanoseconds. It can be seen that the voltages on the bit lines rise linearly in this time frame. This is because the linear switching current is constant with time and the ferroelectric capacitor switching current is approximately constant with time once switching commences. The charge on the bit line increases as the mathematical integral of the current and for a fixed parasitic bit line capacitance the voltage on the bit line therefore also increases linearly. For FIG. 5, the time to latch the sense amplifier connected to preamplifier nodes 462 and 464 is preferably between about 12 and 14 nanoseconds.

FIG. 5 shows that the bit line signals to be detected in this simulation are approximately 7 millivolts. Providing this voltage into a latching sense amplifier with its inherent offset as in the case of the prior art configurations provides little signal margin. However, the self-nulling preamplifier for the 7 millivolt signal on the bit line provides an output voltage of approximately 350 millivolts into the latching sense amplifier, easily overcoming any offset in the latching sense amplifier. This is the primary advantage of using the self-nulling preamplifier.

Alternatively, it may be desirable for the plate line voltage to be returned to ground potential just prior to powering the latching sense amplifier. This means that the plate line is raised in voltage to allow adequate switched charge transfer from the ferroelectric capacitor to the bit lines, followed by a return of the plate line voltage to ground potential. This cycle will cause the charge on the bit lines due to the linear capacitance of the ferroelectric capacitors to be canceled out leaving only the switched charge from the ferroelectric capacitor to be sensed. This decreases the sensitivity of the read operation to mismatches in parameters, such as the linear capacitance of the ferroelectric capacitors and parasitic capacitance of the bit lines. For example, if the bit line capacitances are mismatched by approximately 20%, an extreme mismatch, the cycle shown in FIG. 5 will incorrectly read the memory cell, but the plate line cycle discussed in this paragraph reads the memory cell correctly. The plate line cycle discussed in this paragraph may have the additional advantage of reducing the drive required of the source part of the preamplifier of FIG. 3 depending on the memory array architecture.

Alternatively, a current sensing sense amplifier configuration might be used. If resistors of small resistance values that have voltages of less than about 100 millivolts across them during the sensing portion of the read cycle are connected in series with bit lines 430 and 480 in FIGS. 3 and 4 to ground potential Vss then the circuits in FIGS. 3 and 4 will measure a signal roughly proportional to the differential currents flowing in bit lines 430 and 480. Because it can take considerable silicon area to form such resistors it is preferable to use the self-nulling preamplifier without the resistors that senses the differential charge build up on bit lines 430 and 480 rather than the differential current flowing through bit lines 430 and 480. However, sense amplifiers that sense current without the use of series resistors on the bit lines might become practical.

The self-nulling preamplifier can be used for any integrated circuit memories that use bit lines for read sensing, as one skilled in the art can appreciate, including DRAMs. Operation of a typical DRAM is well known to one skilled in the art. In the case of prior art for a DRAM, the electrode of the linear capacitor in the memory cell not electrically connected to the word line transistor is held at ground potential and is not usually called a plate line (for the purposes of the current invention, a linear capacitor shall be defined as a capacitor that does not polarize, such as a ferroelectric capacitor). The bit lines are precharged to ground potential and the word line transistor is then turned on with the bit line floating. If there is no charge on the linear capacitor connected to the word line transistor, the bit line remains at ground potential. If, from the prior write cycle, there is charge on the linear capacitor connected to the word line transistor, then the bit line charge shares with the linear capacitor and the bit line charges slightly. When the latching sense amplifier connected to the bit line is powered with the reference input to the sense amplifier between ground potential and the voltage on a charged bit line, the sense amplifier latches. The logic state of the memory cell is determined by whether the voltage on the bit line is higher or lower than the reference voltage.

Conversion of the prior art read operation of a DRAM described in the previous paragraph to non-floating bit lines is relatively straightforward to one skilled in the art. The self-nulling preamplifier is connected to the bit line and the output of the self-nulling preamplifier is connected to the input of a conventional latching sense amplifier. The self-nulling preamplifier that nulls out its offset can sense a smaller signal on the bit line than a latching sense amplifier with its inherent offset. Because of the amplification of the preamplifier, very small excursions in bit line voltage can be reliably sensed. The amplified output of the preamplifier overcomes the offset in the latching sense amplifier.

Figure 6:
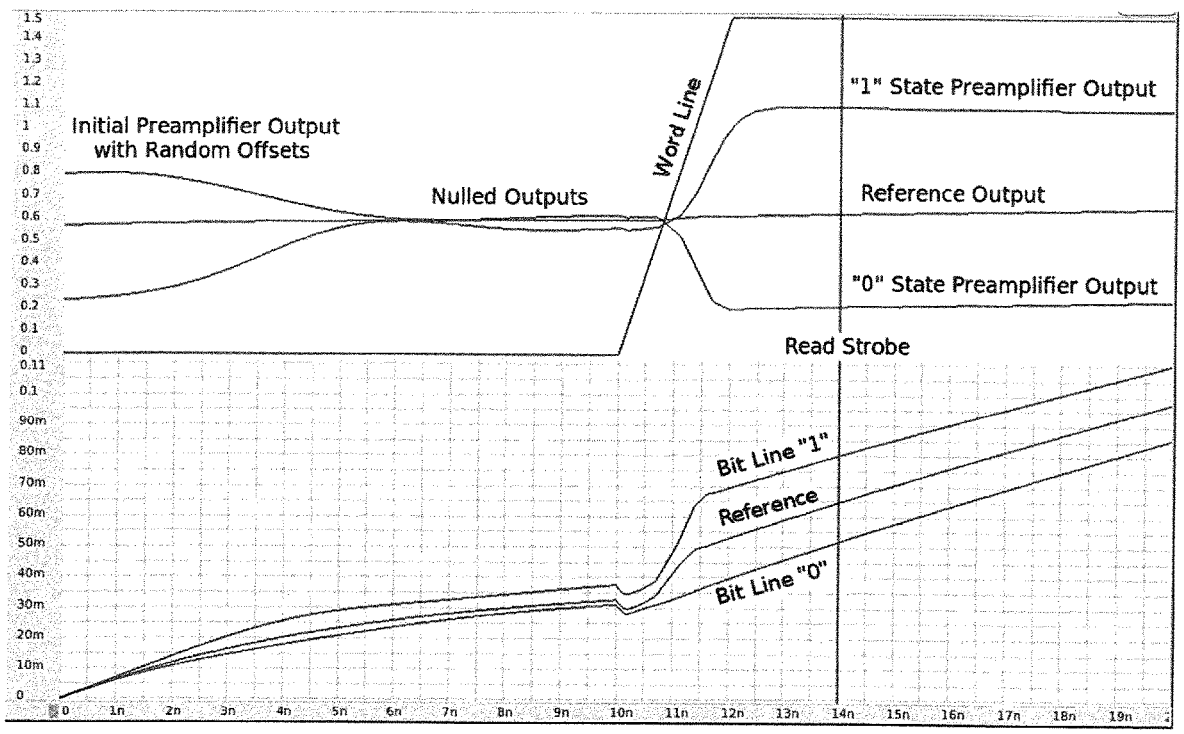
FIG. 6 is a simulation of self-nulling preamplifier output voltages and bit line voltages during the self-nulling operation followed by the read sensing operation for a DRAM.

FIG. 6 shows a simulated timing diagram for the case of a typical DRAM for both logic states. For FIG. 6, the DRAM circuit includes an active memory cell and a reference cell both of which contain a 25 femtofarad linear storage capacitor and a word line access transistor. The reference cells preferably are on a word line row in an adjacent memory array segment where each active memory cell therefore has its own reference cell. In this example, the circuit operates at one volt Vdd power supply for the active memory cells. To provide a reliable reference voltage, the reference cell is programmed with half Vdd (0.5 volt) on the reference cell linear capacitor. The active memory cell will have either one volt for a logic "1" state or zero volts for a logic "0" state programmed on the linear capacitor in the active memory cell. The bit line capacitance for FIG. 6 is one picofarad resulting in a bit line to memory cell capacitance ratio of 40. The bottom half of FIG. 6 shows the bit lines on a 5 millivolt grid while the top half shows the preamplifier signals on a 100 millivolt grid.

Once the preamplifier output nulling is complete, the word line voltage is raised turning on the word line transistor and causing the voltage on the reference bit line to rise an additional approximately 12.5 millivolts consistent with the 12.5 femtocoulombs of reference cell charge stored on the reference linear capacitor. The active memory cell bit line will rise either an additional 25 millivolts or zero millivolts depending on the logic state of the memory cell as indicated in FIG. 6. Without the self-nulling preamplifier, the signal strength into the latching sense amplifier would be approximately 15 millivolts for this example. In contrast, the self-nulling preamplifier provides an amplified output signal into the latching sense amplifier of approximately 400 millivolts for both a logic state "0" and a logic state "1." The self-nulling preamplifier is capable of detecting less than 2 millivolts of relative bit line movement so there is more than ample signal margin at the outputs of the preamplifier to overcome any offset in the latching sense amplifier. Clearly, a 2 millivolt bit line signal to be detected by a latching sense amplifier with offset would not be practical, so the self-nulling preamplifier provides a significant advantage. Smaller DRAM linear capacitors can be used potentially providing for more memory capacity on a single chip of silicon, lower cost per bit, and longer bit lines can be used providing for more efficient DRAM architectures.

The above examples for FRAMs and DRAMs show the advantages of using the self-nulling preamplifier for prior art memories that have used floating bit lines in conjunction with charge storage capacitors. Both FRAMs and DRAMs provide finite charge packets onto the bit lines during the read sensing operation. However, the self-nulling preamplifier can provide advantages for prior art memories that might typically have used non-floating bit lines. These latter types of memories would include magnetic random access memories (MRAMs), resistive random access memories (RRAMs), chalcogenide random access memories (CRAMs), and phase change random access memories (PCRAMs) that sense resistance differences between cells programmed with logic states "1" and "0." Generally, CRAMs and PCRAMs are the same types of memories with just different nomenclature. These latter types of memories would also include Flash memories and static random access memories (SRAMs). In general, all these latter types of prior art memories can provide continuous currents onto the bit lines rather than finite charge packets. However, these latter types of memories can potentially have read signal margin benefits by using the self-nulling preamplifier of the current invention and adjusting the timing in the read cycle to provide appropriate charge packets onto the bit lines.

Alternatively, in the specific case of an FRAM, the FRAM can be converted to non-floating bit lines with improved read signal margin by applying the charge source to the bit line instead of the plate line for the sensing portion of the read cycle. In this configuration the cell and bit line capacitances are configured in an equivalent parallel circuit during the sensing portion of the read cycle. This eliminates the capacitor divider effect that reduces the switching voltage across the ferroelectric capacitor providing almost full voltage across the ferroelectric capacitor for switching the polarization direction of the ferroelectric capacitor. However, charge sharing and reduction of read signal margin still occurs for the voltage generated on the bit line by the switched charge from the memory cell. To reduce this read signal attenuation, the alternative configuration discussed in this paragraph enables lower bit line to cell capacitance ratios to be used, such as by using shorter bit lines or smaller word line transistors. For this alternative method either a conventional latching sense amplifier or the self-nulling preamplifier can be used.

Figure 7:
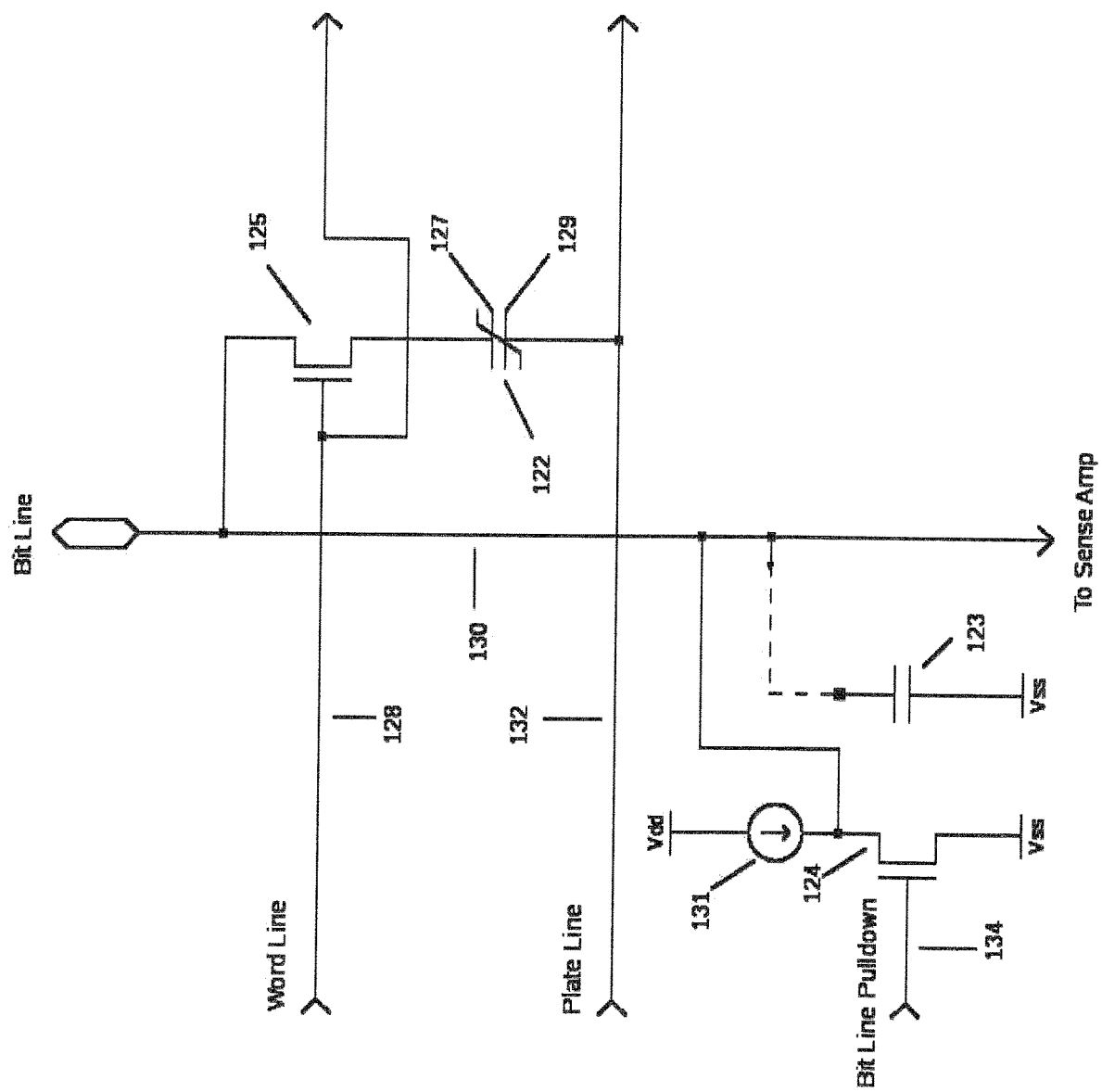
FIG. 7 is a schematic diagram of the preferred embodiment of an FRAM according to the invention when a charge source is connected to the bit line.

FIG. 7 shows a schematic diagram of the current invention for an FRAM for this alternative case where the charge source is connected to the bit line and a latching sense amplifier is used. The charge source applies additional charge to the bit line between the bit line precharge operation and charge modification on the bit line by the memory cell. The configuration shown in FIG. 7 is similar to that shown in FIG. 1 for the prior art, except a charge source 131 that can be switched onto the bit line using pull-down transistor 124 is added. In contrast to conventional operation of the memory cell where the voltage on plate line 132 is increased during the read cycle to provide for the switching of ferroelectric capacitor 122, plate line 132 is held at ground potential. As compared to the prior art, because the switching voltage increases on bit line 130 instead of plate line 132 during the sensing portion of the read cycle, the same state and opposite state of the memory cell are reversed but this does not affect detection of the logic states stored in the memory cells.

With respect to timing, preferably, near the beginning of the read cycle, charge source 131 connected to bit line 130 is turned on with the initial charge flowing through transistor 124 to ground potential Vss. This stabilizes the current flowing out of charge source 131. Having transistor 124 turned on also precharges the bit line to ground potential Vss. Then transistor 124 is turned off allowing the charge flowing from charge source 131 to flow onto bit line 130. This charge causes the voltage on bit line 130 to increase until the voltage difference across ferroelectric capacitor 122 exceeds the switching voltage of ferroelectric capacitor 122. The voltage on bit line 130 at this point will either be lower or higher than the reference voltage depending on whether ferroelectric capacitor 122 switches polarization or not, respectively. Then the sense amplifier is powered allowing the state of the memory cell to be latched into the sense amplifier.

A charge source similar to charge source 131 can also be applied to a reference bit line for the sense amplifier. Because the voltages on the bit lines must become high enough during the sensing portion of the read cycle to cause switching of the direction of the polarization if the ferroelectric capacitor is in the opposite polarization state, it is important that the charge sources on bit line 130 and the reference bit line to the sense amplifier be reasonably matched. A mismatch of approximately five percent can be acceptable depending on the memory array design.

A bench top set up was used to measure the signal strengths corresponding to this alternative configuration for a p-channel implementation. This bench top set up used much larger ferroelectric capacitors than those used in an actual semiconductor circuit in order to reduce the loading effects of the instrumentation on the circuit. This bench top set up also caused the read cycle times to be longer because of the larger ferroelectric capacitors. However, the bench top set up directly measures the signal strengths corresponding to those that occur in a semiconductor circuit.

Figure 8:
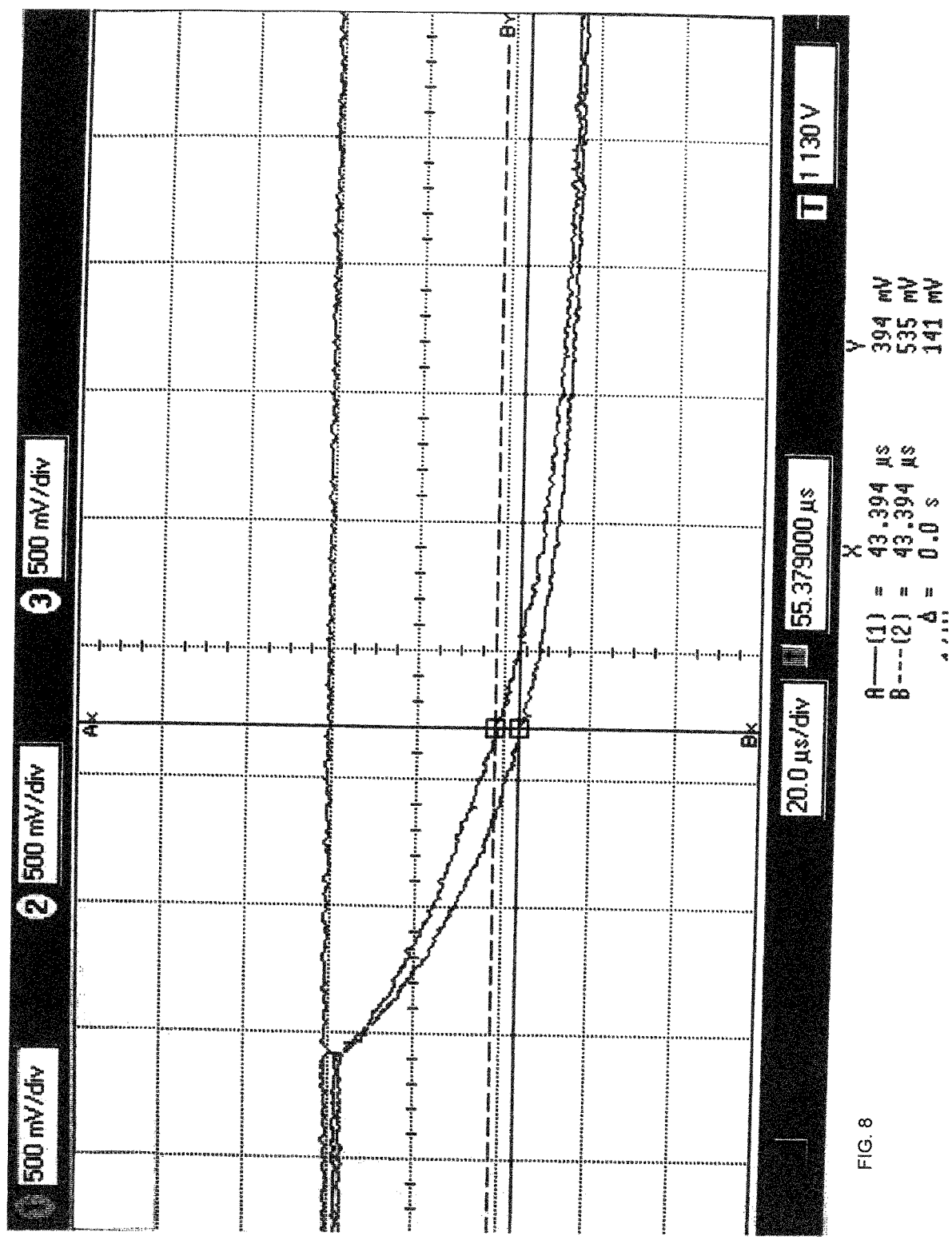
FIG. 8 is a measured plot of the read signal for a bit line to cell capacitance ratio of approximately 6:1 corresponding to the p-channel equivalent circuit of FIG. 7.
Figure 9:
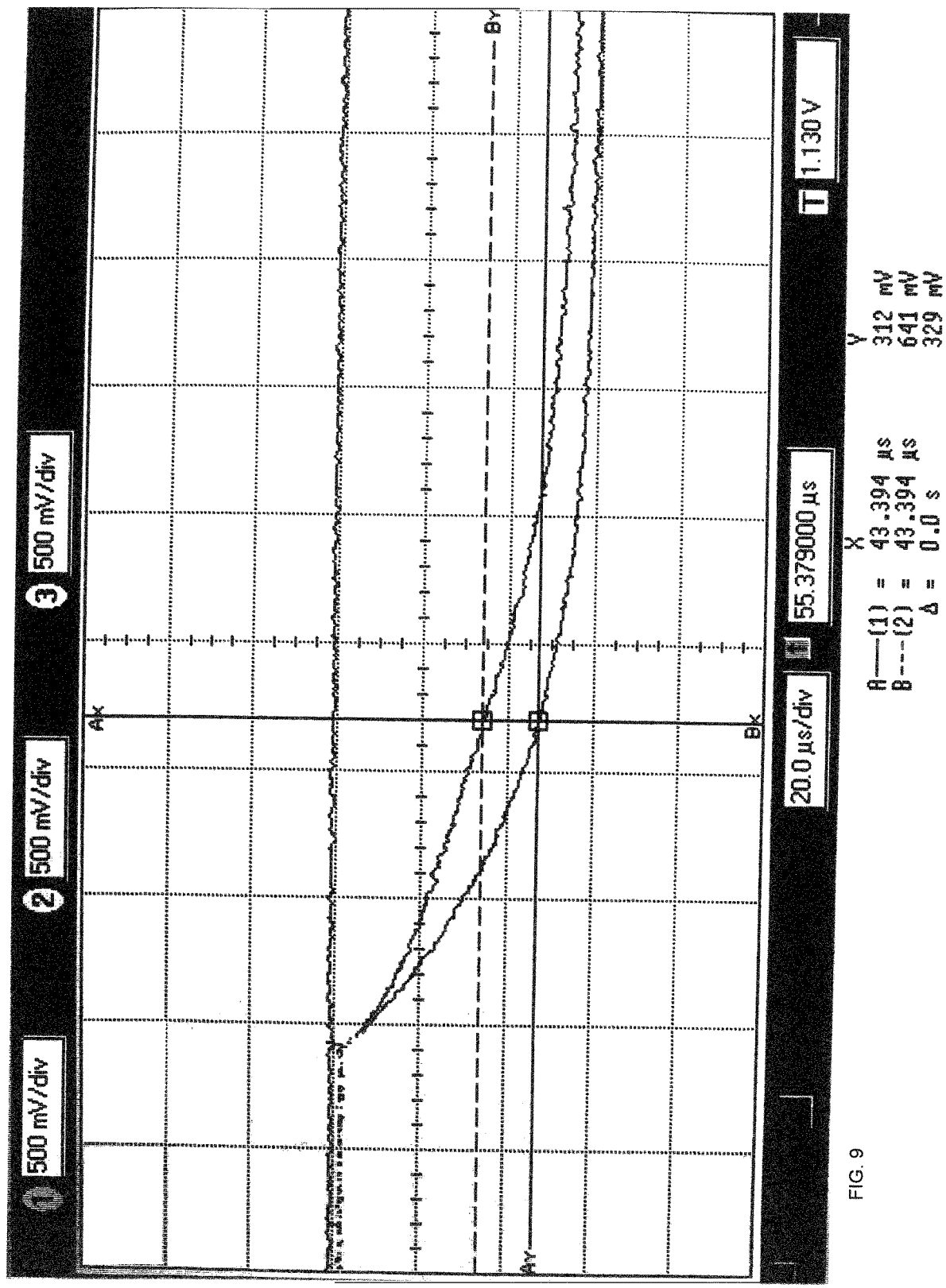
FIG. 9 is a measured plot of the read signal for a bit line to cell capacitance ratio of approximately 2:1 corresponding to the p-channel equivalent circuit of FIG. 7.

Using the bench top set up, FIG. 8 shows measured data for both logic state "0" and logic state "1" as a function of time after the charge source is applied to the bit line for a bit line to cell capacitance ratio of approximately 6 to 1, typical for some of today's FRAMs. Again, using a bench top set up, FIG. 9 shows measured data for both logic states "0" and "1" as a function of time after the charge source is applied to the bit line for a bit line to cell capacitance ratio of approximately 2 to 1. FIGS. 8 and 9 are the actual images of the scope plots and the scales are defined in the boxes on the images. It is not important for these scales to be explained in order to make the observations in the following paragraph.

By comparing FIG. 9 to FIG. 8, the much stronger read signal for the smaller bit line capacitance as determined by the spacing between the two curves in each figure is obvious. Connecting the charge source to the bit line during the sensing portion of the read cycle allows lower bit line capacitances to be used in order to obtain these stronger read signals without sacrificing switching voltage strength across the ferroelectric capacitor.

The preferred embodiment of the current invention includes a reference cell for the self-nulling preamplifier consisting of a pair of ferroelectric memory cells programmed to opposite polarization directions. This same reference cell can be used for the alternative configuration where charge sources are connected to the bit lines. At a predetermined time during the sensing portion of the read cycle, bit lines connected individually to these ferroelectric memory cells are shorted together. The voltage to which these shorted bit lines rise is approximately half way between the voltages developed on a 1T/1C bit line for a logic state "1" and for a logic state "0." In other words, the charge that builds up on the reference bit line is approximately halfway between the charge that builds up on a 1T/1C bit line with a switching ferroelectric capacitor and a 1T/1C bit line with a non-switching ferroelectric capacitor. This same reference cell is also applicable to the alternative FRAM configuration where the charge source is applied to the bit line rather than the plate line. This same reference cell is also applicable to the prior art FRAMs that use floating bit lines.

It is possible to have the two bit lines of the reference cell shorted together for the entire sensing portion of the read cycle. In this case, a charge source for each of the bit lines in the reference circuit are not required, but a single charge source with twice the drive of that for a data memory cell may be used.

It is not necessary for the programmed states of the two ferroelectric capacitors to be strongly polarized, as long as the strengths of two polarization directions are approximately the same. Alternatively, even neutral polarization states (ferroelectric capacitors programmed at the coercive voltage) could be used, but it is more practical and reproducible to use more strongly polarized states.

Alternatively, one bit line connected to the two ferroelectric capacitors in the reference cell might be used. However, the preferred embodiment of the reference cell uses two separate bit lines connected to their respective ferroelectric capacitors because the regular pattern of the memory array is maintained and it is easier to rewrite the reference ferroelectric capacitors to opposite polarization directions at the end of the read cycle.

Figure 10:
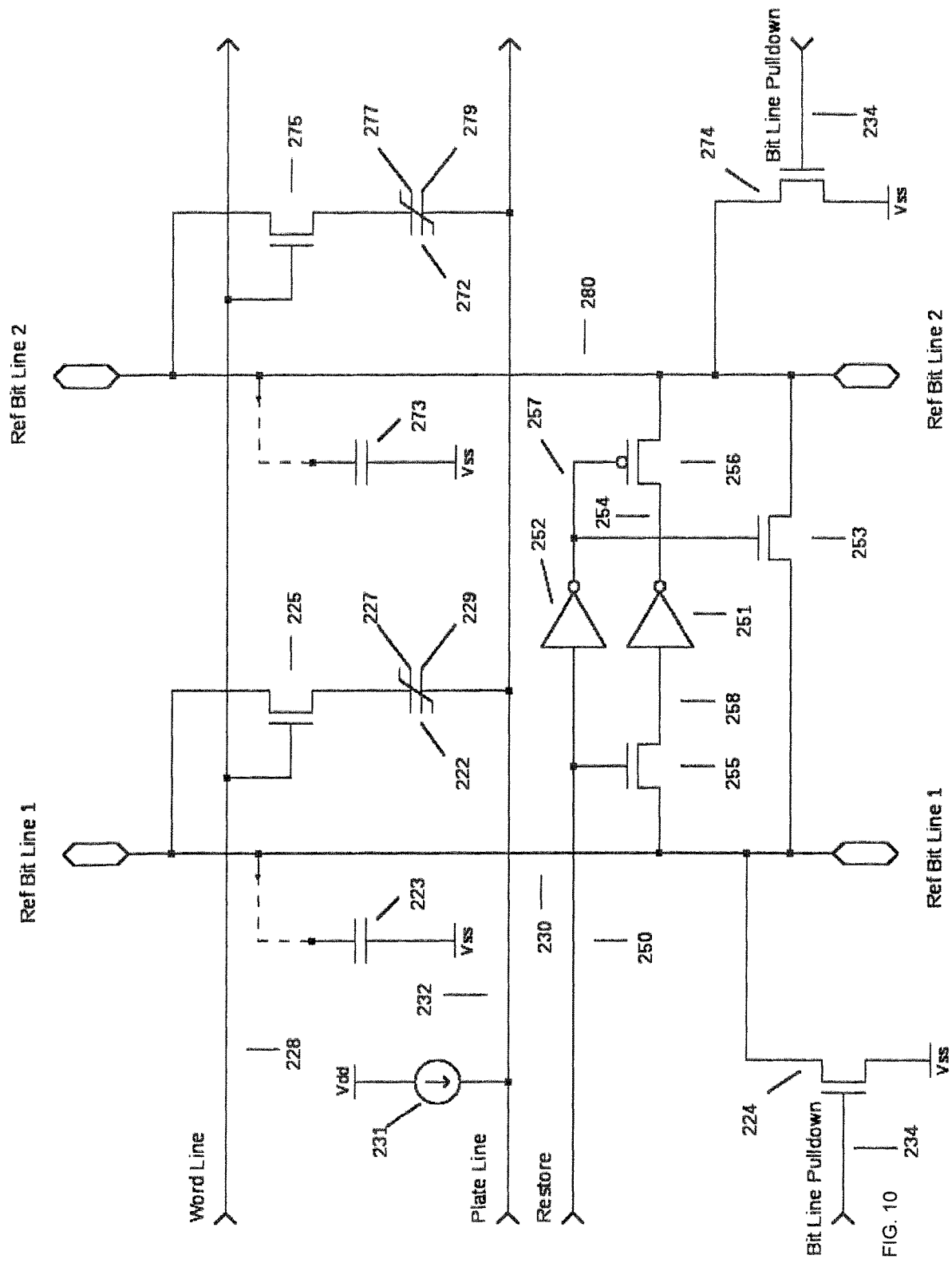
FIG. 10 is a schematic diagram of an FRAM reference cell memory device according to the invention.

FIG. 10 shows a schematic diagram of a reference cell according to the current invention for the preferred embodiment for an FRAM. For the alternative case where the charge source is applied to the bit line, the reference cell would be the same as that in FIG. 10 except charge sources are applied to bit lines 230 and 280 instead of plate line 232. In both cases the bit lines are not floating for the sensing portion of the read cycle. The bit line circuits shown in FIG. 10 are similar to those for the active memory cells except additional devices are added to allow the programming of opposite polarization states in ferroelectric capacitors 222 and 272 during the rewrite portion of the read cycle and additional devices are added to allow shorting of the bit lines during the read cycle. Inverter 252 is added to the reference cell to set opposite polarization directions in ferroelectric capacitors 222 and 272 during the rewrite portion of the read cycle. Preferably, the loading on bit lines 230 and 280 is kept similar by using a pair of transistors 255 and 256 instead of a single transistor on only one of the bit lines. Transistor 256 is a p-channel transistor to provide full voltage on bit line 280 during the rewrite cycle and inverter 252 is used to provide the correct gate voltage on transistor 256. For the rewrite cycle, node 250 is powered causing transistors 255 and 256 to turn on. Inverter 252 then sets opposite voltages on bit lines 230 and 280 causing opposite polarization directions to be programmed into ferroelectric capacitors 222 and 272 at the end of the cycle. During the nulling and sensing portions of the read cycle, transistors 255 and 256 are off. At a predetermined time during the read cycle, transistor 253 is turned on to short bit lines 230 and 280 together. For the preferred embodiment where the charge source is applied to the plate line, this predetermined time is preferably at the commencement of the nulling operation. For the alternate configuration where the charge source is applied to the bit line, this predetermined time is preferably at the beginning of the sensing portion of the read cycle. Shorted bit lines 230 and 280 therefore constitute the reference bit line in FIGS. 3, 4 and 7. Either bit line 230 or bit line 280 can be connected to bit line 430 in FIGS. 3 and 4 because ultimately bit lines 230 and 280 are shorted together.

Figure 11:
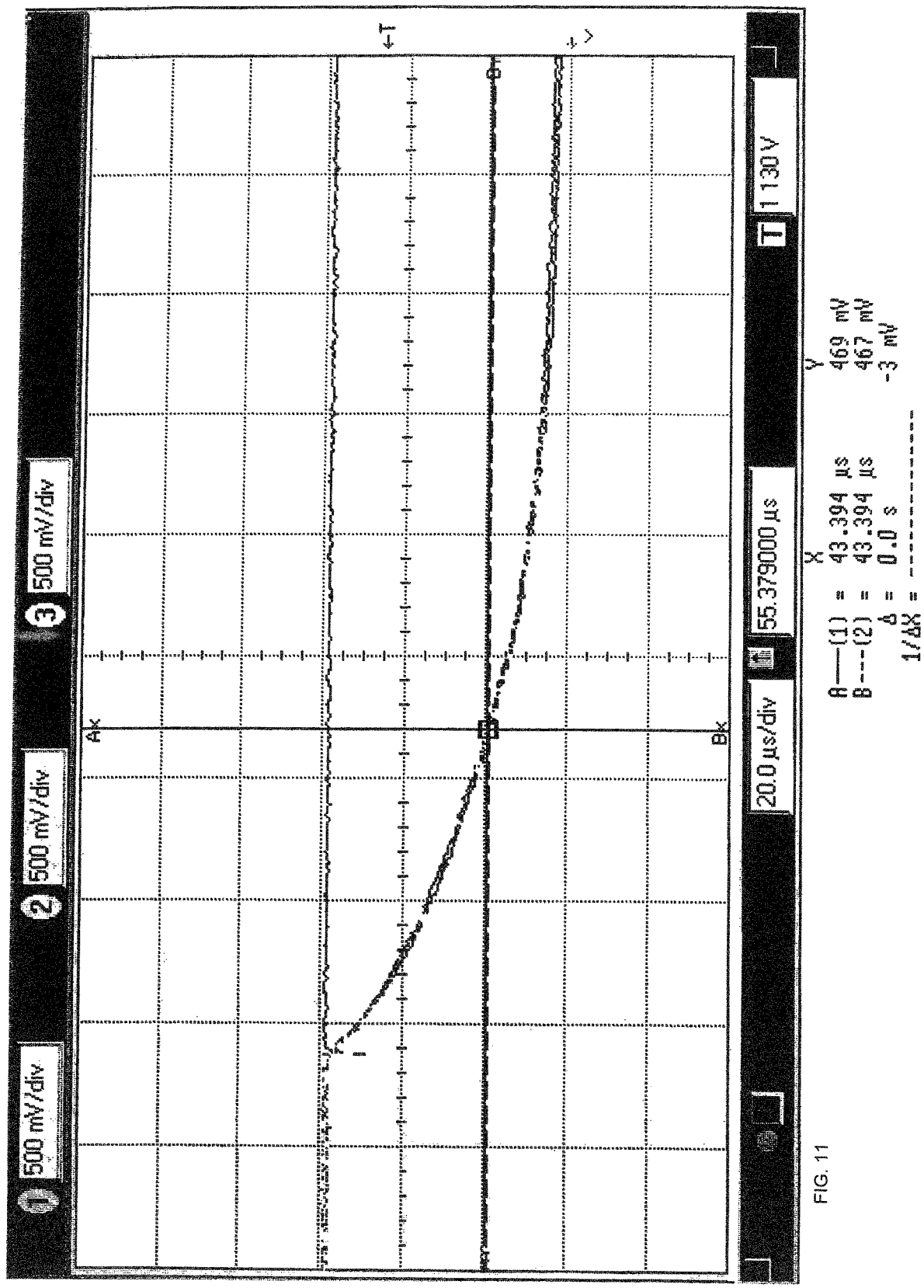
FIG. 11 is a measured plot of the FRAM reference signal corresponding to the p-channel equivalent circuit of FIG. 10.

Shorting bit lines 230 and 280 together with ferroelectric capacitors 222 and 272 programmed to opposite polarization directions allows the reference voltage on shorted bit lines 230 and 280 to be approximately half way between the voltages generated on the active bit lines for logic states "1" and "0" independent of the time during the sensing portion of the read cycle. This is a key advantage over using a fixed voltage reference. Using the same bench top set up as before, this is most easily shown in FIG. 11 for the alternative case where the charge sources are applied to the bit lines. Comparison of FIG. 11 to FIGS. 8 and 9 shows that the reference voltage generated by the circuit in FIG. 10 is approximately half way between the voltages generated for logic states "1" and "0" on bit line 130 in FIG. 7. This provides a reliable reference voltage for sense amplifiers connected to FRAM memory cells without much sensitivity as to when in the sensing portion of the read cycle the sense amplifiers are powered to latch the data. This reference cell will also track the active ferroelectric memory cells with temperature and other operating conditions because the reference cell for the sense amplifier is created by actual ferroelectric memory cells.

The polarization directions of the two ferroelectric capacitors in the reference cell can be alternated after each time the reference cell is accessed. By alternating the polarization directions, ferroelectric effects that can adversely affect the reference cell, such as imprint where a ferroelectric capacitor develops a preferred polarization direction, are mitigated.

As can be appreciated by one skilled in the art, the reference cell architecture described in the current invention that includes the reference bit lines can be used as a reference for prior art ferroelectric memories that use floating bit lines during the read sensing portion of the read cycle.

A typical high density integrated circuit memory design partitions the memory array into smaller memory array segments. The reference cells can be created by using additional bit lines in the same memory array segment as the data memory cells. In this case, the circuit shown in FIG. 10 must be designed with adequate drive to drive multiple instances of the circuitry with the active bit lines as shown previously in FIG. 3. Alternatively, a voltage follower circuit based on a current mirror configuration might be used to provide additional drive from node 464 from the reference circuit. Voltage follower circuits are well known to one skilled in the art. Note that while any offset in the voltage follower circuit will also be managed by the self-nulling circuitry, the reference voltages can be small so the design of such voltage follower circuits is tricky and careful attention must be paid to noise rejection.

Alternatively, a word line of reference memory cells in a different and preferably adjacent memory segment of the memory array can be used with a given memory segment of 1T/1C FRAM memory cells to provide a reference for all word lines in that given memory segment. In this case, two bit lines are used for the two ferroelectric capacitors in the reference word line, so each reference cell preferably drives two sense preamplifiers in the given memory segment keeping the loading on the 1T/1C bit lines and the reference cell bit lines approximately the same. However, the reference memory cells get stressed every time any word line in the segment is read causing the degradation of the ferroelectric capacitors in the reference cells to be more than that of the individual word lines because of endurance limitations. For example, if there are 1024 word lines in a segment and each word line is read once, each word line may be stressed only once but the reference word lines may be stressed 1024 times. If endurance is not an issue, then this approach is acceptable. Also, a pseudo non-destructive read allows the word line of reference memory cells to be used without too much concern for possible endurance issues.

Alternatively, if the reference ferroelectric capacitors are programmed to neutral polarization states by applying the coercive voltage to the ferroelectric capacitor during the rewrite portion of the read cycle, then only one reference cell and one reference bit line may be needed. However, because the ferroelectric capacitor hysteresis curve can be relatively steep with voltage around the coercive voltage, it may be difficult to accurately program a neutral polarization state. Therefore, the preferred embodiment of the current invention uses two ferroelectric capacitors programmed to opposite states for the reference cell for 1T/1C FRAM architectures.

In the alternative case of using the self-nulling preamplifier and non-floating bit lines for a DRAM, a reference cell preferably consists of a DRAM memory capacitor on a single bit line programmed at a voltage lower than that used for the active memory cells. Preferably, this lower voltage is approximately one half the programming voltage of an active memory cell to allow the voltage on the reference bit line to be approximately half way between the voltage generated on a bit line when reading a data state "1" or a "0." For the DRAM case, it is preferable to use a word line of reference memory cells in a different and preferably adjacent memory segment of the memory array to provide a reference for all word lines in that given memory segment. Endurance is not an issue for linear DRAM memory storage capacitors.

Alternatively, the size of the DRAM memory capacitor on the reference word line in the adjacent memory segment could be approximately one half the size of an active memory cell linear capacitor, but this would have the disadvantage of causing a disruption in the regular pattern of the memory array. Alternatively, as in the case of an FRAM, a DRAM reference cell consisting of a pair of bit lines with linear DRAM capacitors programmed to a logic state "1" and a logic state "0" and then shorted together at a predetermined time during the sensing portion of the read cycle could be used, but this configuration offers no perceived advantage over using a single linear DRAM capacitor for the reference.

For the self-nulling preamplifier of the current invention when used with a DRAM, it is preferable to use a reference bit line as discussed above rather than a fixed voltage reference. The signal of the reference cell will also track those of the active memory cells depending on the recombination rate of minority carriers in the silicon and the refresh time of the DRAM, as can be appreciated by one skilled in the art.

What is claimed is:

1. A method of reading the logic state of an integrated circuit memory, including the steps of,
   providing a first bit line,
   connecting an amplifier having an offset voltage to said first bit line, and
   providing a current from said amplifier to said first bit line that is a function of the offset voltage of said amplifier during the offset voltage nulling portion of a read cycle where the offset voltage nulling portion of the read cycle requires no switching of the bit lines to the amplifier.

2. The method of claim 1 where said amplifier is a current mirror voltage amplifier.

3. The method of claim 1, and further comprising the steps of,
   providing a second bit line,
   separating said amplifier into a current mirror source circuit and a current mirror receiver circuit,
   connecting said current mirror source circuit to said second bit line,
   providing a plurality of current mirror receiver circuits,
   providing a plurality of first bit ones,
   connecting each of said plurality of current mirror receiver circuits to a respective one of said plurality of first bit lines, and
   connecting each of said current mirror receiver circuits to said current mirror source circuit.

4. The method of claim 1, and further comprising the steps of,
   applying a voltage to said first bit line,
   connecting a first memory cell to said first bit one,
   exchanging the charge between said first bit line and said first memory cell, and
   sensing the logic state of said first memory cell.

5. The method of claim 4 where said first memory cell includes a ferroelectric capacitor.

6. The method of claim 4, and further comprising the steps of,
   providing a second bit line,
   applying a voltage to said second bit line,
   connecting said amplifier to said second bit line, and providing a current from said amplifier to said second bit line that is a function of the offset voltage of said amplifier during the offset voltage nulling portion of a read cycle.

7. The method of claim 6, and further comprising the step of,
connecting a first output of said amplifier to a first input of a latching sense amplifier that is powered at a predetermined time.

8. The method of claim 6, and further comprising the steps of,
providing a plurality of memory array segments, and
locating said first and second bit lines in the same memory array segment.

9. The method of claim 6, and further comprising the steps of,
providing a plurality of memory array segments,
placing said first bit line in a first memory array segment, and
placing said second bit line in a second memory array segment.

10. The method of claim 6 where said second bit line is a reference bit line.

11. The method of claim 6, and further comprising the steps of,
connecting a second memory cell to said second bit line, and
exchanging the charge between said second bit line and said second memory cell.

12. The method of claim 11 where the integrated circuit memory is a dynamic random access memory, and further comprising the step of,
programming said second memory cell with a voltage between the voltages used to program a logic one and a logic zero in said first memory cell to provide a reference signal.

13. The method of claim 11 where the integrated circuit memory is a dynamic random access memory, and further comprising the step of,
providing said second memory cell with a capacitance less than the capacitance of said first memory cell to provide a reference signal.

14. The method of claim 11, and further comprising the steps of,
applying a voltage to a third bit line,
connecting a third memory cell to said third bit line,
transferring charge between said third memory cell and said third bit line,
programming said second memory cell to one binary logic state,
programming said third memory cell to the opposite binary logic state of said second memory cell, and
connecting said second and third bit lines together to provide a reference signal.

15. The method of claim 14, and further comprising the steps of,
providing a plurality of memory array segments, and
locating said first, second and third bit lines in the same memory array segment.

16. The method of claim 14, and further comprising the steps of,
providing a plurality of memory array segments,
placing said first bit line in a first memory array segment, and
placing said second and third bit lines in a second memory array segment.

17. The method of claim 16, and further comprising the step of,
connecting said reference signal to one input each of two sense amplifiers.

18. The method of claim 14 where said first, second and third memory cells contain ferroelectric capacitors.

19. The method of claim 11 where said first and second memory cells include ferroelectric capacitors capable of being polarized in two directions of polarization.

20. The method of claim 19, and further comprising the step of,
programming said second memory cell with a voltage that provides only partial polarization switching of the ferroelectric capacitor in said second memory cell.

21. The method of claim 19, and further comprising the step of,
programming said first memory cell with a voltage that provides only partial polarization switching of the ferroelectric capacitor in said first memory cell in order to provide a pseudo non-destructive read operation of said first memory cell.

22. The method of claim 19, and further comprising the step of,
programming the polarization direction of the ferroelectric capacitor in said second memory cell to the opposite polarization direction of the ferroelectric capacitor in said first memory cell.

23. A method of reading the logic state of a ferroelectric integrated circuit memory that includes a sensing portion of a read cycle, comprising the steps of,
applying a voltage to a first bit line,
connecting a first charge source to said first bit line,
connecting to said first bit line a sense amplifier,
connecting to said first bit line a first memory cell comprising a ferroelectric capacitor having a coercive voltage,
applying a charge from said first charge source to said first bit line during the sensing portion of the read cycle prior to latching or powering the sense amplifier to provide a voltage on said first bit line of at least the coercive voltage of the ferroelectric capacitor in said first memory cell, and
sensing the logic state of said first memory cell.

24. The method of claim 23, and further comprising the steps of,
applying a voltage to a second bit line,
connecting a second charge source to said second bit line,
connecting to said second bit line said sense amplifier,
connecting to said second bit line a second memory cell comprising a ferroelectric capacitor having a coercive voltage, and
applying a charge from said second charge source to said second bit line during the sensing portion of the read cycle prior to latching or powering said sense amplifier to provide a voltage on said second bit line of at least the coercive voltage of the ferroelectric capacitor in said second memory cell.

25. A method of reading the logic state of an integrated circuit memory that uses a destructive read cycle having a sensing portion of a read cycle, including the steps of,
providing a bit line,
providing a memory cell having a circuit element providing an electrical charge to said bit line,
connecting an amplifier to said bit line, and providing a current from said amplifier to said bit line without the bit lines floating during the sensing portion of a read cycle prior to the rewrite portion of the read cycle.

26. The method of claim 25 where said amplifier is a differential amplifier.

27. The method of claim 25 where said amplifier is a current mirror voltage amplifier.

28. The method of claim 25 where the bit lines are continuously connected to said amplifier during the sensing portion of a read cycle prior to the rewrite portion of the read cycle.

* * * * *